*(12)* United States Patent
Reginelli et al.

(10) Patent No.: US 7,842,960 B2
(45) Date of Patent: Nov. 30, 2010

(54) LIGHT EMITTING PACKAGES AND METHODS OF MAKING SAME

(75) Inventors: James Reginelli, Parma, OH (US); Srinath K. Aanegola, Broadview Heights, OH (US); Emil Radkov, Euclid, OH (US)

(73) Assignee: Lumination LLC, Cleveland, OH (US)

( * ) Notice: Subject to any disclaimer, the term of this patent is extended or adjusted under 35 U.S.C. 154(b) by 774 days.

(21) Appl. No.: 11/516,533

(22) Filed: Sep. 6, 2006

(65) Prior Publication Data

US 2008/0054280 A1    Mar. 6, 2008

(51) Int. Cl.
*H01L 21/00* (2006.01)

(52) U.S. Cl. .................. 257/98; 257/100; 257/E33.056; 257/E33.073

(58) Field of Classification Search .................. 257/98, 257/100; 438/27
See application file for complete search history.

(56) References Cited

U.S. PATENT DOCUMENTS

| | | | |
|---|---|---|---|
| 5,093,576 A | 3/1992 | Edmond | |
| 5,526,455 A | 6/1996 | Akita et al. | |
| 5,812,717 A | 9/1998 | Gilliland | |
| 5,959,316 A | 9/1999 | Lowery | |
| 5,962,971 A | 10/1999 | Chen | |
| 6,294,800 B1 | 2/2001 | Duggal et al. | |
| 6,204,523 B1 | 3/2001 | Carey | |
| 6,234,648 B1 | 5/2001 | Borner et al. | |
| 6,335,548 B1 | 1/2002 | Roberts et al. | |
| 6,404,131 B1 * | 6/2002 | Kawano et al. | 315/82 |
| 6,410,940 B1 | 6/2002 | Jiang et al. | |
| 6,429,583 B1 | 8/2002 | Levinson et al. | |
| 6,498,355 B1 | 12/2002 | Harrah et al. | |
| 6,504,301 B1 | 1/2003 | Lowery | |
| 6,522,065 B1 | 2/2003 | Srivastava et al. | |
| 6,538,371 B1 | 3/2003 | Duggal et al. | |

(Continued)

FOREIGN PATENT DOCUMENTS

CA    2220031    1/2004

(Continued)

OTHER PUBLICATIONS

Cookson Electronics, "Imaging Technologies Update," Enthone Inc., No. 12, pp. 2, Jun. 2002.

(Continued)

*Primary Examiner*—Ahmed Sefer
(74) *Attorney, Agent, or Firm*—Fay Sharpe LLP

(57) ABSTRACT

In a light emitting package (8), at least one light emitting chip (12, 14, 16, 18) is supported by a board (10). A light transmissive encapsulant (30) is disposed over the at least one light emitting chip and over a footprint area (32) of the board. A light transmissive generally conformal shell (40) is disposed over the encapsulant and has an inner surface (44) spaced apart by an air gap (G) from, and generally conformal with, an outer surface (34) of the encapsulant. At least one phosphor (50) is disposed on or embedded in the conformal shell to output converted light responsive to irradiation by the at least one light emitting chip. A thermally conductive filler material disposed in the generally conformal shell (40) is effective to enhance a thermal conductivity of the composite shell material to a value higher than 0.3 W/(m·K).

12 Claims, 2 Drawing Sheets

U.S. PATENT DOCUMENTS

| | | |
|---|---|---|
| 6,541,800 B2 | 4/2003 | Barnett et al. |
| 6,578,986 B2 | 6/2003 | Swaris et al. |
| 6,590,235 B2 | 7/2003 | Carey |
| 6,600,175 B1 | 7/2003 | Baretz et al. |
| 6,621,211 B1 | 9/2003 | Srivastava et al. |
| 6,635,987 B1 | 10/2003 | Wojnarowski et al. |
| 6,642,618 B2 | 11/2003 | Yagi et al. |
| 6,657,379 B2 | 12/2003 | Ellens et al. |
| 6,661,030 B2 | 12/2003 | Komoto |
| 6,670,748 B2 | 12/2003 | Ellens et al. |
| 6,674,233 B2 | 1/2004 | Ellens et al. |
| 6,683,325 B2 | 1/2004 | Waitl et al. |
| 6,812,503 B2 | 11/2004 | Lin et al. |
| 6,817,783 B2 | 11/2004 | Lee et al. |
| 6,917,057 B2 | 7/2005 | Stokes et al. |
| 7,029,935 B2 | 4/2006 | Negley et al. |
| 7,101,061 B2 | 9/2006 | Nagai et al. |
| 2001/0000622 A1 | 5/2001 | Reeh et al. |
| 2002/0043926 A1 | 4/2002 | Takahashi et al. |
| 2002/0079506 A1 | 6/2002 | Komoto et al. |
| 2002/0084745 A1 | 7/2002 | Wang et al. |
| 2002/0084748 A1 | 7/2002 | Ayala et al. |
| 2002/0117676 A1 | 8/2002 | Katoh |
| 2002/0158578 A1 | 10/2002 | Eliashevich et al. |
| 2002/0163006 A1 | 11/2002 | Yoganandan et al. |
| 2003/0038291 A1 | 2/2003 | Cao |
| 2003/0039119 A1 | 2/2003 | Cao |
| 2003/0039120 A1 | 2/2003 | Cao |
| 2003/0067265 A1 | 4/2003 | Srivastava et al. |
| 2003/0107046 A1 | 6/2003 | Waitl et al. |
| 2003/0141563 A1 | 7/2003 | Wang |
| 2003/0146690 A1 | 8/2003 | Ellens et al. |
| 2003/0210555 A1 | 11/2003 | Cicero et al. |
| 2004/0000867 A1 | 1/2004 | Chen |
| 2004/0012027 A1 | 1/2004 | Keller et al. |
| 2004/0051111 A1 | 3/2004 | Ota et al. |
| 2004/0056256 A1 | 3/2004 | Bokor et al. |
| 2004/0070001 A1 | 4/2004 | Lee et al. |
| 2004/0190304 A1* | 9/2004 | Sugimoto et al. ............ 362/555 |
| 2004/0217383 A1* | 11/2004 | Krames et al. .............. 257/202 |
| 2004/0227149 A1 | 11/2004 | Ibbetson et al. |
| 2004/0256630 A1 | 12/2004 | Cao |
| 2005/0093430 A1 | 5/2005 | Ibbetson et al. |
| 2005/0127378 A1* | 6/2005 | Suehiro et al. ................ 257/81 |
| 2005/0224829 A1* | 10/2005 | Negley et al. .................. 257/99 |
| 2005/0239227 A1* | 10/2005 | Aanegola et al. .............. 438/26 |
| 2006/0012991 A1 | 1/2006 | Weaver et al. |
| 2006/0054915 A1 | 3/2006 | Chang |
| 2006/0097245 A1 | 5/2006 | Aanegola et al. |
| 2007/0120135 A1* | 5/2007 | Soules et al. .................. 257/98 |
| 2007/0159091 A1* | 7/2007 | Hirosaki et al. ............. 313/512 |
| 2007/0235751 A1* | 10/2007 | Radkov et al. .............. 257/103 |

FOREIGN PATENT DOCUMENTS

| | | |
|---|---|---|
| CA | 2496937 | 3/2004 |
| CA | 2515647 | 9/2004 |
| CA | 2517009 | 9/2004 |
| CA | 2523544 | 11/2004 |
| CA | 2549822 | 5/2005 |
| DE | 4208172 B4 | 5/2006 |
| EP | 859967 B1 | 8/1999 |
| EP | 2000156526 | 6/2000 |
| EP | 2000208818 | 7/2000 |
| EP | 1081771 | 3/2001 |
| EP | 1191608 | 3/2002 |
| EP | 1 418 628 | 5/2004 |
| EP | 942474 B1 | 4/2006 |
| EP | 1573870 | 7/2007 |
| GB | 2347018 A | 8/2000 |
| GB | 2413896 A | 9/2005 |
| GB | 2424123 A | 9/2006 |
| JP | 10-282916 | 10/1998 |
| JP | 2000-101148 | 4/2000 |
| JP | 2000-123620 | 4/2000 |
| JP | 2000-156526 | 6/2000 |
| JP | 2000-164012 | 6/2000 |
| JP | 2000-315822 | 11/2000 |
| JP | 2000-315824 | 11/2000 |
| JP | 2001-035239 | 2/2001 |
| JP | 2001-057445 | 2/2001 |
| JP | 01-173239 | 6/2001 |
| JP | 2001-243807 | 9/2001 |
| JP | 2001-243809 | 9/2001 |
| JP | 2001-274463 | 10/2001 |
| JP | 2002-141558 | 5/2002 |
| JP | 2002-150821 | 5/2002 |
| JP | 2002-261328 | 9/2002 |
| JP | 2002-304902 | 10/2002 |
| JP | 2003-023183 | 1/2003 |
| JP | 2003-037298 | 2/2003 |
| JP | 2003-110150 | 4/2003 |
| JP | 2003-110151 | 4/2003 |
| JP | 2003-206481 | 7/2003 |
| JP | 2003-206482 | 7/2003 |
| JP | 2003-224306 | 8/2003 |
| KR | 100405453 | 11/2003 |
| TW | 457731 B | 12/1999 |
| WO | WO 02/089175 | 11/2002 |
| WO | WO 02/091489 | 11/2002 |
| WO | WO 2004/075308 | 2/2004 |
| WO | WO 2004/021461 A2 | 3/2004 |
| WO | WO 2004/023522 | 3/2004 |
| WO | WO 2004/077580 | 10/2004 |
| WO | WO 2004/100213 A2 | 11/2004 |
| WO | WO 2004/100279 | 11/2004 |
| WO | WO 2005/004202 * | 1/2005 |
| WO | WO 2005/043627 | 5/2005 |
| WO | WO 2005/057672 A2 | 6/2005 |
| WO | WO 2005/103555 | 11/2005 |
| WO | WO 2005106926 A2 | 11/2005 |
| WO | WO 2006/019730 | 2/2006 |
| WO | WO 2006/067885 | 6/2006 |

OTHER PUBLICATIONS

D 5470, "Standard Test Method for Thermal Transmisson Properties . . . ," ASTM International, pp. 1-6, 2006.

* cited by examiner

LIGHT EMITTING PACKAGES AND METHODS OF MAKING SAME

BACKGROUND

The following relates to the lighting arts, and to light emitting packages based on one or more light emitting chips and to methods for making same.

Light emitting packages based on light emitting chips, such as semiconductor light emitting diode chips, organic light emitting diode chips, semiconductor laser chips, and so forth, are increasingly used for illumination. Each chip typically produces radiation that is saturated light at a single color point, such as red light, green light, blue light, or so forth, or violet or ultraviolet light over a narrow spectral range. It is known to operatively couple the chip with a wavelength converting phosphor so as to produce a desired light output such as an approximate white light output. Additionally, the chip typically emits incoherent and unfocused radiation. (An exception are laser diode chips, which may produce coherent and directional radiation.) It is further known to couple the LED (optionally coated with phosphor) with a focusing lens. For example, the lens may be a molded encapsulant shaped into a desired lensing configuration, or may be a separately fabricated "microlens" that is positioned over and in optical communication with the chip. Still further, in view of the limited light output provided by a single chip, it is known to use an array or combination of chips.

Existing light emitting packages have been less than fully satisfactory. Soft molded encapsulants, for example, are typically prone to damage due to abrasion, exposure to corrosive chemicals, or so forth. Separately fabricated microlenses can be more robust, but require careful placement over the chip. Moreover, for illumination it is typically not desired to focus the light.

Multiple chip packages provide greater illumination, but generally increase package complexity. Some example multiple chip packages are disclosed in Lowery, U.S. Pat. No. 6,504,301, which shows various arrangements involving generally wire-bonded interconnection of a plurality of light emitting dice disposed on a support placed in a housing including a cylindrical casing and a fluorescent plate. Other example multiple chip packages are disclosed in Baretz et al., U.S. Pat. No. 6,660,175. Baretz discloses a phosphor contained in an encapsulant disposed inside the housing. The complexity of multiple chip packages such as those of Lowery and Baretz can adversely impact manufacturability, reliability, and manufacturing costs.

CROSS-REFERENCE TO RELATED APPLICATIONS

Application Ser. No. 10/831,862 filed Apr. 26, 2004 and published as US 2005-0239227 A1, and international application no. PCT/US2003/027363 filed Aug. 29, 2003 and published as WO 2004/021461 A2, each relate at least to various aspects of light emitting packages some of which include arrangements of remote phosphors. In some example embodiments illustrated in these applications, one or more light emitting chips are disposed on a board, such as a printed circuit board, and are covered by a dome-shaped glass shell or other light-transmissive shell. A remote phosphor is disposed on or embedded in the shell. An encapsulant is injected into the interior volume defined by the joined board and dome-shaped shell so as to at least substantially fill the shell. In operation, radiation generated by the one or more light emitting chips couples with the remote phosphor disposed on or in the shell, and the remote phosphor converts the radiation to converted light with desired spectral characteristics. For example, in some embodiments described in these applications the chip or chips emit ultraviolet or violet radiation, and the remote phosphor converts the radiation to visible light that approximates white light.

This application incorporates by reference the entire content of application Ser. No. 10/831,862 filed Apr. 26, 2004 and published as US 2005-0239227 A1. This application further incorporates by reference the entire content of International application no. PCT/US2003/027363 filed Aug. 29, 2003 and published as WO 2004/021461 A2.

BRIEF SUMMARY

According to one aspect, a light emitting package is disclosed. At least one light emitting chip is supported by a board. A light transmissive encapsulant is disposed over the at least one light emitting chip and over a footprint area of the board. A light transmissive generally conformal shell is disposed over the light transmissive encapsulant and has an inner surface spaced apart by an air gap from and generally conformal with an outer surface of the light transmissive encapsulant. At least one phosphor is disposed on or embedded in the conformal shell and is configured to output converted light responsive to irradiation by the at least one light emitting chip.

According to another aspect, a light emitting package is disclosed. At least one light emitting chip is supported by a board. A generally dome-shaped light transmissive encapsulant is disposed over the at least one light emitting chip and over a generally elliptical or circular footprint area of the board that extends at least two millimeters beyond an outermost edge of the at least one light emitting chip.

According to another aspect, a lighting package is disclosed. One or more light emitting chips are configured to collectively generate at least about the one watt of optical output power. A board supports the one or more light emitting chips. A light transmissive encapsulant is disposed over the one or more light emitting chips and over a footprint area of the board. At least one remote phosphor is disposed in a phosphor layer region located remote from the one or more light emitting chips and proximate to an outer surface of the light transmissive encapsulant. The remote phosphor is configured to output converted light responsive to irradiation by the one or more light emitting chips. A heat sinking component in thermal communication with substantially all of the phosphor layer region comprises a material having a thermal conductivity that is higher than 0.3 W/(m·K).

According to another aspect, a method of manufacturing a light emitting package is disclosed. At least one light emitting chip is secured to a board. A light transmissive encapsulant is disposed over the at least one light emitting chip and over a footprint portion of the board. A light transmissive generally conformal shell is disposed over the light transmissive encapsulant. The disposed conformal shell has an inner surface spaced apart by an air gap from and generally conformal with an outer surface of the light transmissive encapsulant. At least one phosphor is disposed on or embedded in the conformal shell. The at least one phosphor is configured to output converted light responsive to irradiation by the at least one light emitting chip.

BRIEF DESCRIPTION OF THE DRAWINGS

The invention may take form in various components and arrangements of components, and in various process opera

DETAILED DESCRIPTION OF PREFERRED EMBODIMENTS

Figure 1:
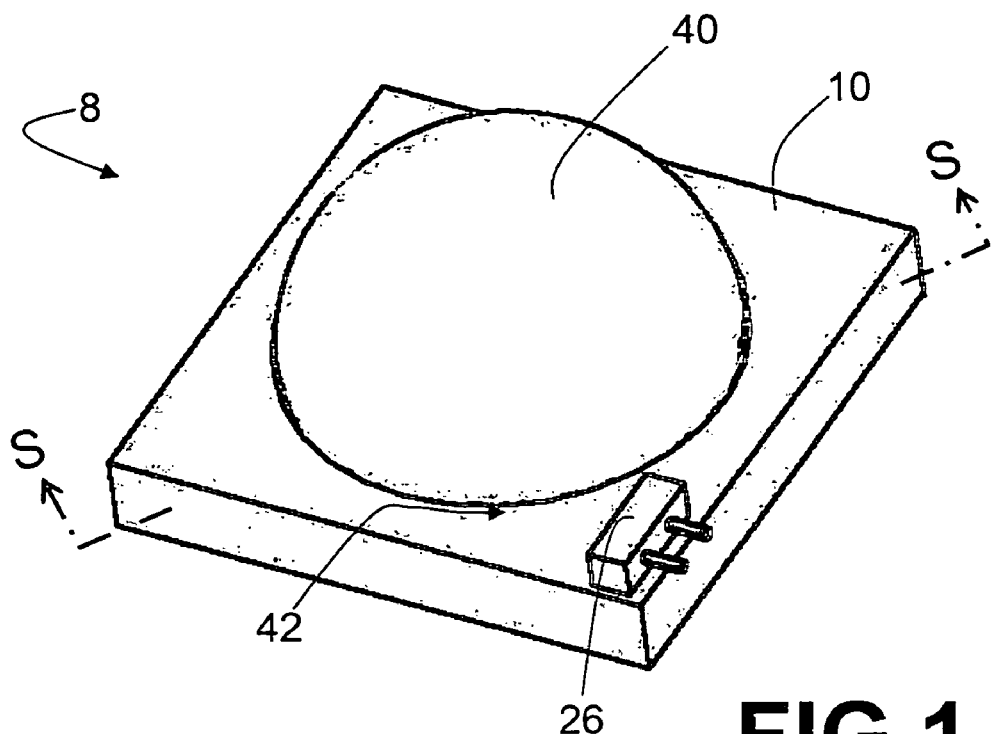
- FIG. 1 shows a perspective view of a lighting package.
Figure 2:
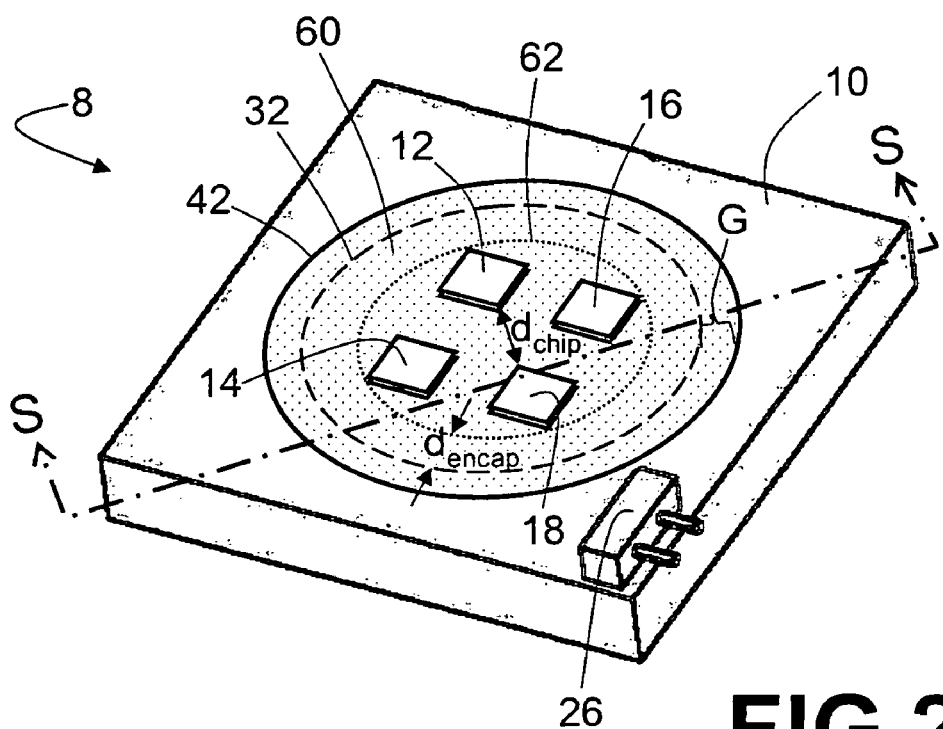
FIG. 2 shows a perspective view of the light emitting package of FIG. 1, with the light-transmissive encapsulant and conformal shell removed.
Figure 3:
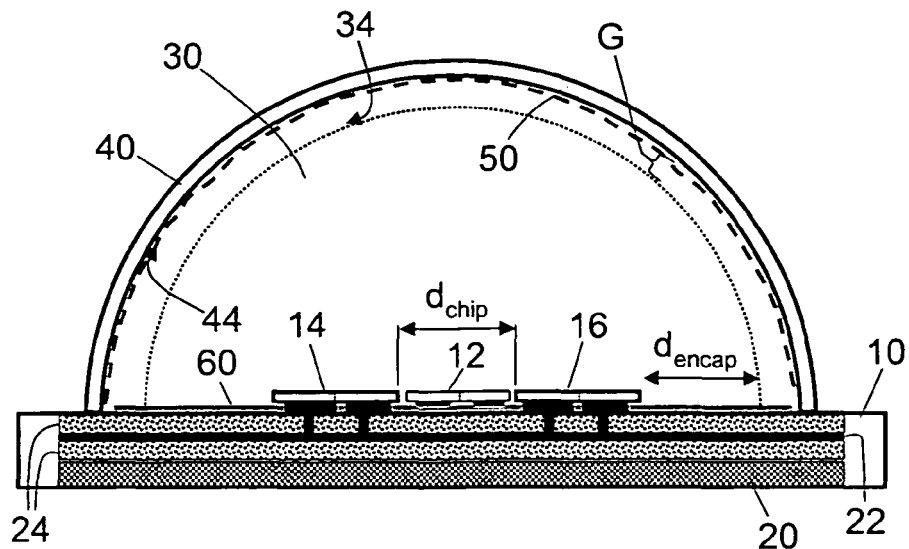
FIG. 3 shows a side-sectional view of the light emitting package of FIG. 1 taken along a Section S-S indicated in FIGS. 1 and 2.

With reference to FIGS. 1-3, a light emitting package 8 includes a board 10, such as a printed circuit board, metal-core printed circuit board, insulated heat-sinking board, or so forth on which a plurality of light emitting dice or chips 12, 14, 16, 18 are disposed. The board 10 is preferably substantially thermally conductive. For example, a metal core printed circuit board can be employed. In the illustrated embodiment, four light emitting dice or chips 12, 14, 16, 18 are disposed on the board 10; however, the number of dice or chips can be one, two, three, four, five, or more. The chips 12, 14, 16, 18 can be group III-nitride blue, violet, or ultraviolet light emitting diode chips, red group III-phosphide or group III-arsenide light emitting diode chips, II-VI light emitting diode chips, IV-VI light emitting diode chips, silicon or silicon-germanium light emitting diode chips, or the like. Although semiconductor light emitting diode chips 12, 14, 16, 18 are illustrated herein, in other contemplated embodiments the chip or chips may be edge emitting laser chips or vertical cavity surface emitting laser (VCSEL) chips, organic light emitting diode chips, or so forth. Each illustrated light emitting chip 12, 14, 16, 18 is a bare chip without individual encapsulant. Alternatively, each chip can be separately encapsulated. Still further, the chip or chips can include a monolithic array of light emitting diode mesas, a monolithic array of vertical cavity surface emitting laser mesas, or the like. Although the illustrated example four light emitting chips 12, 14, 16, 18 are of the same kind (for example, all four being violet or ultraviolet emitting light emitting diode chips), in other embodiments two or more different kinds of chips may be used. For example, a combination of red, green, and blue chips can be used to collectively approximate white light.

The light emitting chips 12, 14, 16, 18 may be attached to the board 10 in various ways. In the illustrated embodiment, the board 10 is a metal core printed circuit board including (see FIG. 3) a copper plate 20 or other metal core and a printed circuitry layer 22 sandwiched between dielectric layers 24. Optionally, an additional insulation layer (not shown) may be disposed over the backside of the metal core layer 20. Moreover, it is contemplated to include two or more separate and distinct printed circuitry layers. The chips 12, 14, 16, 18 are flip-chip bonded to bonding pads that electrically connect with the printed circuitry layer 22 of the board 10. Such flip-chip bonding provides both mechanical securing of the chips 12, 14, 16, 18 to the board 10 and electrical input paths for electrically powering the chips 12, 14, 16, 18. For example, a connector 26 disposed on the board 10 suitably enables electrical power coupling to the board 10 to power the chips 12, 14, 16, 18 via the printed circuitry layer 22.

The chips 12, 14, 16, 18 may be lateral chips having both n- and p-electrodes on the same side of the chip and contacting the board 10 by flip chip bonds. In other embodiments, the chips 12, 14, 16, 18 are vertical chips with electrodes are on opposite sides of the chip, and one electrode is soldered or flip-chip bonded to a bonding pad of the board 10 while another electrode on an opposite side of the chip is contacted by wire bonding. In other embodiments, the chip can include two electrodes both contacted by wire bonding, and the chip soldered to the board to provide mechanical attachment to the board. Although not illustrated, the chips may be disposed in reflective wells, on raised pedestals, on sub-mounts, or so forth. The board 10 optionally supports other components (not shown) operatively connected via the printed circuitry layer 22 or by wire bonding or the like with the light emitting chips 12, 14, 16, 18. For example, the board 10 may support a Zener diode to provide electrostatic discharge protection, power regulating circuitry, voltage stabilizing circuitry, current-limiting circuitry, rectifying circuitry, or so forth.

A light-transmissive encapsulant 30 (shown in FIG. 3) is disposed over the light emitting chips 12, 14, 16, 18 and over a footprint area 32 (indicated by a dashed line in FIG. 2) of the board. The illustrated encapsulant 30 is generally dome-shaped and the footprint 32 is a generally elliptical or circular area. More precisely, the illustrated encapsulant 30 is hemispherically shaped and the footprint 32 is generally circular with a radius equal to the radius of the hemispherical encapsulant 30; however, a dome-shaped encapsulant that is flattened, of elliptical cross-section, or otherwise deviates from hemispherical is also contemplated. For the illustrated hemispherically shaped encapsulant 30 with the centroid of the light emitting chips 12, 14, 16, 18 positioned at about the center of the circular footprint 32, symmetry provides that the encapsulant 30 does not substantially distort the angular distribution of emitted light. The encapsulant 30 is a solid encapsulant that seals the chips 12, 14, 16, 18, and has an exposed outer surface 34 that in the illustrated embodiment is a hemispherical surface since the illustrated example encapsulant 30 is hemispherically shaped. The encapsulant 30 may, for example, be a silicone or epoxy encapsulant.

A light transmissive generally conformal cover or shell 40 is disposed over the light transmissive encapsulant 30, and is attached to the board 10 along a perimeter 42 by silicone adhesive or another adhesive, or by a mating groove (not shown) formed into the surface of the board 10, or by another securing mechanism or combination of securing mechanisms. The conformal shell 40 has an inner surface 44 that is generally conformal with the outer surface 34 of the light transmissive encapsulant 30. Moreover, the inner surface 44 of the conformal shell 40 is spaced apart from the outer surface 34 of the encapsulant 30 by an air gap G indicated in FIGS. 2 and 3. The conformal shell 40 may, for example, be a glass or quartz conformal shell, or may be a plastic, Teflon, epoxy, EVA, acrylic, or other organic material shell.

In some embodiments, a remote phosphor 50 is disposed in a phosphor layer region located remote from the light emitting chips 12, 14, 16, 18 and proximate to the outer surface 34 of the light-transmissive encapsulant 30. For example, the phosphor may be disposed on or embedded in the conformal shell 40. In the illustrated embodiment, the phosphor 50 is disposed on the inner surface 44 of the conformal shell 40 (phosphor 50 indicated in FIG. 3 by a dashed line); however, the phosphor may be disposed on the outside of the conformal shell 40, or embedded in the material of the conformal shell 40. It is also contemplated to dispose the phosphor on the outer surface 34 of the light-transmissive encapsulant 30. The phosphor 50 is configured to output converted light responsive to irradiation by the light emitting chips 12, 14, 16, 18. If provided, the phosphor 50 is selected to produce a desired wavelength conversion of a portion or substantially all of the radiation produced by the light emitting dice or chips 12, 14, 16, 18. The term "phosphor" is to be understood as including a single phosphor compound or a phosphor blend or composition of two or more phosphor compounds chosen to produce a selected wavelength conversion, as known in the art. For example, the phosphor 50 may be a phosphor composition including yellow, green, and blue emitting phosphor compounds that cooperatively provide white or substantially white light. This white or substantially white light may, for instance, may possess an x value in the range of about 0.30 to about 0.55, and a y value in the range of about 0.30 to about 0.55 in the 1931 CIE chromaticity diagram. In some embodiments, the phosphor 50 can also have an optional red emitting compound for better color rendering. In some embodiments, the light emitting dice or chips 12, 14, 16, 18 are group III-nitride light emitting diode chips that emit violet or ultraviolet radiation principally at wavelengths less than 425 nanometers, and the phosphor 50 converts most or all of the light generated by the chips 12, 14, 16, 18 into white or substantially white light. For white output, the phosphor and light emitting chip are selected to provide a suitable color temperature and color rendering of the lamp. In some embodiments, the light emitting dice or chips 12, 14, 16, 18 are group III-nitride light emitting diode chips that emit blue or bluish radiation, and the phosphor 50 is a yellowish phosphor that converts only some of the blue or bluish radiation to yellowish light. The ratio of direct (unconverted) bluish light and converted yellowish light is selected to approximate white light. Those skilled in the art can readily select other phosphors suitable for performing specific light conversions.

To promote light extraction, a reflective coating 60 (diagrammatically indicated in FIG. 2 by dot-shading of the coated area) is optionally disposed over at least most of the generally elliptical or circular footprint area 32 of the board 10. In the illustrated embodiment, the reflective coating 60 is disposed over most of the area within the perimeter 42 of the conformal shell 40. The reflective coating 60 is reflective for radiation produced by the light emitting dice or chips 12, 14, 16, 18, and is preferably thermally stable at temperatures used in fabricating the light emitting package 8 and at operating temperatures of the light emitting chips 12, 14, 16, 18.

In some embodiments, the reflective coating 60 is made of legend ink of a type typically used for forming printed markings, legends, or other labeling on printed circuit boards. Such legend ink is typically white or yellowish, and provides high reflectivity for visible, violet, and near ultraviolet radiation. Advantageously, when using legend ink for the reflective coating 60 it is possible to form the reflective coating 60 simultaneously with the formation of printed markings, legends, or other labeling of the printed circuit board 10. The same photolithography or other patterning used to define the printed markings, legends or other labeling suitably also defines the area of the legend ink reflective coating 60.

With continuing reference to FIGS. 2 and 3, certain dimensional aspects of the light emitting package 8 are preferably selected to increase light extraction. When a plurality of light emitting chips are used, it is advantageous to have an interchip spacing (indicated as $d_{chip}$ in FIGS. 2 and 3) of at least about one times a principal lateral dimension of a largest chip of the plurality of light emitting chips 12, 14, 16, 18. Interchip spacing of at least this size substantially reduces radiation losses due to cross-chip absorption of edge-emitted radiation. Moreover, having the encapsulant 30 hemispherically shaped with the footprint area 32 of the board generally circular with a radius about equal to a radius of the hemispherical light transmissive encapsulant 30 enhances spatial uniformity of the light output. Still further, the extent $d_{encap}$ of the encapsulant 30 beyond the outermost edge of the light emitting chip or chips 12, 14, 16, 18 affects radiation extraction efficiency for the outer regions of the one or more chips. Denoting the outermost edge of the plurality of light emitting chips 12, 14, 16, 18 by a diameter 62 (indicated by a dotted line in FIG. 2), having the encapsulant 30 extend a distance $d_{encap}$ that is at least two millimeters beyond the outermost edge 62 of the chips 12, 14, 16, 18 substantially promotes efficient light extraction efficiency.

In the illustrated embodiment, the air gap G is present between the outer surface 34 of the encapsulant 30 and the spaced-apart inner surface 44 of the conformal shell 40. This air gap G advantageously provides a large tolerance for relative positioning of the encapsulant 30 and conformal shell 40, which enhances manufacturability of the light emitting package 8. However, the air gap G also introduces relatively large and abrupt refractive index transitions at the outer surface 34 of the encapsulant 30 (where the refractive index abruptly jumps downward from the refractive index of the encapsulant material to the 1.00 refractive index of air) and at the inner surface 44 of the conformal shell 40 (where the refractive index abruptly jumps upward from the 1.00 refractive index of air to the refractive index of the material of the conformal shell 40). Typically, such abrupt, large refractive index transitions are avoided in the optical design of light emitting packages, since they are expected to produce light scattering that degrades the light extraction efficiency.

However, in the light emitting package 8 using chips that emit radiation principally below 425 nanometers in wavelength, the inventors have found that this air gap G does not substantially degrade light extraction efficiency. To verify this, devices were fabricated with the hemispherical encapsulant 30 and the conformal hemispherical glass shell 40 with the phosphor 50 disposed on the inner surface 44, both with and without the air gap G. In some tested devices, the air gap G was at least about 0.5 millimeter, and was typically about 1-2 millimeters. No significant difference in performance was observed between devices with and without the air gap. Based on these experiments, it is believed that as long as there is sufficient volume of encapsulant material around each die to provide sufficient encapsulation (for example, enough hemispherical encapsulant 30 to extend a distance $d_{encap}$ of at least two millimeters beyond the outermost edge of the light emitting chip or chips 12, 14, 16, 18), the optical performance will be substantially independent of whether the encapsulant fully fills the hemispherical shell (that is, no air gap), or has the air gap G.

Without being limited to any particular theory of operation, it is believed that good optical performance is achieved in spite of the presence of the air gap G for at least the following reason. The radiation emitted by the chips 12, 14, 16, 18 is principally below 425 nanometers in wavelength, and exits the outer surface 32 of the dome-shaped encapsulant 30 with substantial refraction. However, this refraction is not problematic, because the exiting radiation nonetheless interacts with the phosphor 50 that conformally surrounds the outer surface 32 of the dome-shaped encapsulant 30. This interaction will occur regardless of the extent of refraction at the outer surface 32. Once wavelength conversion occurs due to the phosphor 50, the converted light readily escapes the thin conformal shell 40 to be emitted as extracted light. Accordingly, no substantial light extraction loss is incurred by the presence of the air gap G in the light emitting package 8.

Figure 4:
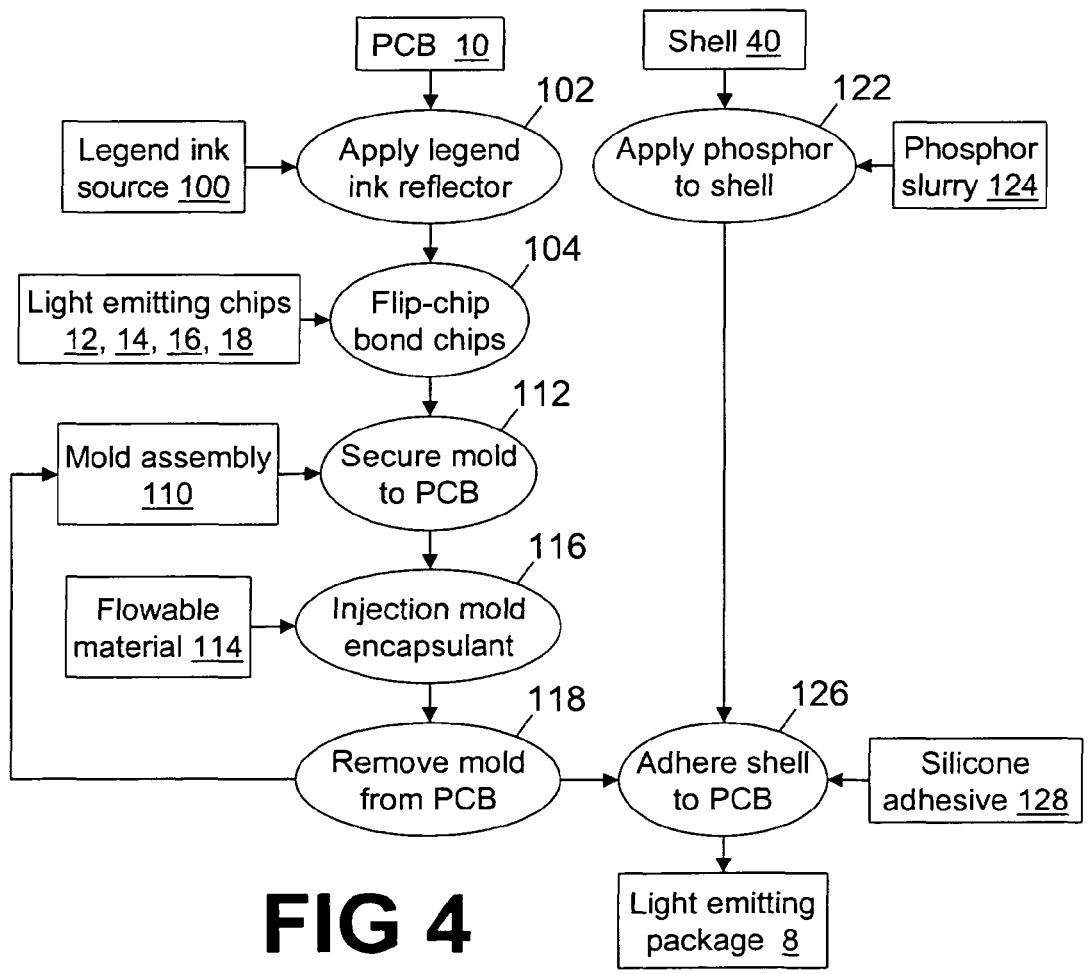
FIG. 4 diagrams an example process for manufacturing the light emitting package of FIGS. 1-3.

With reference to FIG. 4, a suitable process for manufacturing the light emitting package 8 is described. A legend ink source 100 provides legend in that is applied in a process operation 102 to the board 10. In some embodiments, the legend ink application process 102 includes a photolithographic or other patterning operation to define the legend ink reflective coating 60 as well as to simultaneously define any printed markings, legends, or other labeling on printed circuit board 10. The process operation 102 is suitably identical to ordinary marking by legend ink, except that the mask or other pattern-defining element includes the additional reflective coating 60.

The light emitting chips 12, 14, 16, 18 are flip-chip bonded to the board 10 in a bonding process 104. Other bonding processes can be used, as appropriate for the configuration of the chips—for example, wire bonding may be incorporated into the bonding if the chips include one or more front-side electrodes.

The dome-shaped light-transmissive encapsulant 30 is formed over the chips 12, 14, 16, 18. In the process of FIG. 4, an injection molding process is used. A mold assembly 110 is secured to the printed circuit board 10 in a process operation 112. The mold assembly 110 is secured such that the gap between the mold 110 and the board 10 is a sealed gap so that the footprint area 32 of the board 10 and mold assembly 110 collectively define a hollow mold die for forming the encapsulant 30. A flowable material 114 is then injected into the hollow mold die and cured or hardened in the mold in an injection molding process 116. The curing process may include passage of time, application of heat, light exposure, or so forth. In some embodiments for forming the encapsulant 30 of silicone, the flowable silicone encapsulant precursor is injected into the hollow mold die and is cured for 15-45 minutes at a temperature of at least 100° C. The cured flowable material is rigid and non-flowable, and defines the encapsulant 30. After curing, the mold assembly 110 is removed from the printed circuit board 10, leaving the hardened encapsulant 30 attached to the footprint area 32 of the board 10. Advantageously, the mold assembly 110 is typically reusable.

With continuing reference to FIG. 4, a parallel phosphor application process 122 is performed before, after, or concurrently with the process operations 102, 104, 112, 116, 118. A phosphor slurry 124 or other phosphor source is applied to the inner surface 44 of the conformal shell 40. In some embodiments, the phosphor slurry 124 employs a flowable silicone base or matrix material in which the phosphor particles are dispersed. The flowable silicone base or matrix material with dispersed phosphor is spray coated onto the inner surface 44 of the conformal shell 40. Optionally, the thusly applied phosphor 50 is then cured by time passage, heating, light exposure, or so forth.

The phosphor-coated conformal shell 40 is then secured over the dome-shaped encapsulant 30 in an adhesion process 126 that in some embodiments employs a silicone adhesive 128. Advantageously, the air gap G provides a large tolerance for the mechanical positioning of the conformal shell 40 over the dome-shaped encapsulant 30, which simplifies manufacturing and increases yield. Additionally, the air gap G accommodates the phosphor layer 50 when such layer is disposed on the inner surface 44 of the conformal shell 40 (or, alternatively, when the phosphor layer is disposed on the outer surface of the encapsulant as in other contemplated embodiments). Since in the manufacturing process of FIG. 4 the conformal shell 40 is not used as a sealed hollow mold die for forming the encapsulant 30, the attachment of the shell 40 along the perimeter 42 can be a non-sealing attachment.

The manufacturing process of FIG. 4 has been described respective to a single light emitting package 8. However, it will be appreciated that the process is readily scaled up by forming numerous such packages on a common printed circuit board that is later broken up along pre-formed fracture lines, or cut by mechanical sawing, or otherwise separated. In such an approach, the mold assembly 110 suitably includes numerous hemispherical die elements for simultaneously injection molding numerous dome-shaped encapsulants 30 on the common printed circuit board. The conformal shells 40 are suitably attached using an automated step-and-apply mechanical jig, where again the air gap G provides large mechanical tolerances that simplify the adhering process 126 and increase its robustness.

Heretofore, it has generally been assumed that the use of a remote phosphor (as opposed to a phosphor directly coating the light emitting chips) is sufficient to address heat-related degradation of the phosphor and neighboring components. However, the inventors have found this is not the case when high power light emitting chips are used in devices having the configuration of FIGS. 1-3. Devices were fabricated with the hemispherical encapsulant 30 and the conformal hemispherical glass shell 40 with the phosphor 50 disposed on the inner surface 44, and with the air gap G. After running such devices continuously for about one week, heat-induced darkening of the devices was observed. This was attributed to thermal degradation at or in the vicinity of the remote phosphor 50.

Typically, phosphors performing wavelength conversion generate heat by two principal mechanisms: Stokes' heat from the wavelength down conversion, which is typically about 20-25% of the incident radiometric power for blue to violet light excitation; and heat from the quantum "inefficiency" (1-QE), which is typically 10-30% of the incident radiometric power. Thus, up to about one-half or more of the incident radiometric power may be converted to heat by the phosphor due to operation of the driving light emitting chips. The effects of Stokes' and quantum inefficiency heating mechanisms can be alleviated by reducing the incident radiometric flux, such as by using a remote phosphor arrangement. However, when the chip radiometric power levels are sufficiently high, the inventors' experiments show that the host material containing the phosphor 50, or the conformal shell 40 in proximity to the remote phosphor 50, or other thermally sensitive material in proximity to the remote phosphor, may undergo undesirable thermal degradation over time. For example, when the one or more light emitting chips collectively generate at least about the one watt of optical output power, substantial thermal degradation over time is expected. Such power output can be produced, for example, by three light emitting chips each generating about 0.3 watts of optical output power for a collective optical output power of about 0.9 watts.

Optionally, the thermal conductivity of the conformal shell 40 is enhanced to provide improved heat sinking for the phosphor 50. This can be done, for example, by incorporating thermally a conductive filler material into the conformal shell 40 such that the thermal conductivity of the material of the shell 40 is substantially increased without substantially decreasing its translucency. If the air gap G is sufficiently small (or is omitted entirely) such that the phosphor 50 is in sufficiently high thermal communication with the encapsulant 30, then additionally or alternatively the conductive filler material can be disposed in the encapsulant 30 to enhance thermal conductivity of the encapsulant material to provide heat sinking of the phosphor 50.

Suitable thermally conductive filler materials include, for example: alumina, aluminum nitride, boron nitride, zinc oxide, various metal oxides, nitrides or so forth. To reduce undesirable light attenuation, the thermally conductive filler material is advantageously a transparent or translucent material, and comprising between about 5 wt-% and about 60 wt-% (that is, weight-percent) of the host material. Additionally or alternatively, light attenuation is optionally reduced by using thermally conductive filler material dispersed in the conformal shell 40 or other host in the form of nanometer-sized particles, for example with particle size less than 100 nm, in order to avoid light attenuation. In some embodiments, the thermally conductive filler material is added to provide a thermal conductivity of the filled composite material that is higher than 0.3 W/(m·K), for example as measured in accordance with test methods promulgated in standard ASTM D5470 (ASTM International, West Conshohocken, Pa., USA). In some embodiments, the thermally conductive filler material is added to provide a thermal conductivity of the filled composite material that is higher than 1 W/(m·K), for example as measured according to the standard ASTM D5470. By comparison, a typical value for optical silicone (without added thermally conductive filler) is 0.1 W/(m·K), and for potting compound a typical value is 0.25 W/(m·K).

Substantial thermal degradation was observed experimentally for the configuration of FIGS. 1-3 that included the air gap G. However, it is expected that similar thermal degradation will be observed with any remote phosphor disposed on or dispersed in relatively thermally insulating material prone to thermal degradation, such as epoxy resin.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:

The invention claimed is:

1. A lighting package comprising:
   at least one light emitting chip;
   a board supporting the at least one light emitting chip;
   a light-transmissive encapsulant disposed over the at least one light emitting chip and over a footprint area of the board;
   a light-transmissive generally conformal shell disposed over the light-transmissive encapsulant and having an inner surface spaced apart by an air gap from and generally conformal with an outer surface of the light-transmissive encapsulant; and
   a phosphor disposed on or embedded in the conformal shell and configured to output converted light responsive to irradiation by the at least one light emitting chip;
   wherein the light-transmissive encapsulant and conformal shell are generally hemispherical and the footprint area of the board is generally circular with a radius about equal to a radius of the hemispherical light-transmissive encapsulant and the air gap between the outer surface of the light-transmissive encapsulant and the inner surface of the conformal shell is at least about 0.5 millimeter.

2. The lighting package as set forth in claim 1, wherein the generally circular footprint area of the board extends at least two millimeters beyond an outermost edge of the at least one light emitting chip.

3. The lighting package as set forth in claim 2, wherein the at least one light emitting chip includes a plurality of light emitting chips arranged on the board with an inter-chip spacing of at least about one times a principal lateral dimension of a largest chip of the plurality of light emitting chips.

4. The lighting package as set forth in claim 1, wherein the at least one light emitting chip is configured to emit violet or ultraviolet radiation and the phosphor is configured to convert substantially all of the radiation emitted by the at least one light emitting chip into converted light in the visible wavelength range.

5. The lighting package as set forth in claim 1, wherein the at least one light emitting chip is configured to emit radiation having a spectrum that is principally below 425 nanometers in wavelength, and the phosphor is configured to convert substantially all of the radiation emitted by the at least one light emitting chip into white or substantially white light.

6. The lighting package as set forth in claim 1, wherein the conformal shell is formed of a material having a thermal conductivity that is higher than 0.3 W/(m·K).

7. The lighting package as set forth in claim 6, wherein the conformal shell is formed of a material having a thermal conductivity that is higher than 1 W/(m·K).

8. The lighting package as set forth in claim 1, further comprising:
   a layer of legend ink disposed over at least most of the generally elliptical or circular footprint area of the board.

9. A lighting package comprising:
   one or more light emitting chips;
   a board supporting the one or more light emitting chips;
   a light-transmissive encapsulant disposed over the one or more light emitting chips and over a footprint area of the board; and
   a remote phosphor disposed in a phosphor layer located remote from the one or more light emitting chips and proximate to an outer surface of the light-transmissive encapsulant, the remote phosphor configured to output converted light responsive to irradiation by the one or more light emitting chips;
   wherein a heat-sinking component in contact with substantially the whole phosphor layer comprises a material having a thermal conductivity that is higher than 0.3 W/(m·K).

10. The lighting package as set forth in claim 9, wherein the heat-sinking component includes a light-transmissive generally conformal shell, and the light-transmissive generally conformal shell comprises:
    a thermally conductive filler material disposed in the light-transmissive generally conformal shell such that the light-transmissive generally conformal shell is made of a composite shell material having thermal conductivity higher than 1 W/(m·K).

11. The lighting package as set forth in claim 9, comprising wherein the heat-sinking component includes:
    a generally conformal glass shell disposed over the light-transmissive encapsulant, the generally conformal glass shell comprising glass and a thermally conductive filler material disposed in the glass wherein the glass with the thermally conductive filler material has a thermal conductivity higher than 0.3 W/(m·K).

12. The lighting package as set forth in claim 9, wherein the heat-sinking component in contact with substantially the whole phosphor layer comprises nanometer-sized thermally conductive filler particles with particle size less than 100 nm.

* * * * *